(12) United States Patent
Motschman et al.

(10) Patent No.: US 8,139,355 B2
(45) Date of Patent: Mar. 20, 2012

(54) MEMORY MODULE CONNECTOR HAVING MEMORY MODULE COOLING STRUCTURES

(75) Inventors: David R. Motschman, Rochester, MN (US); Mark E. Steinke, Jr., Durham, NC (US); Aparna Vallury, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/786,067

(22) Filed: May 24, 2010

(65) Prior Publication Data

US 2011/0286179 A1 Nov. 24, 2011

(51) Int. Cl.
*H05K 7/20* (2006.01)

(52) U.S. Cl. ............... 361/679.54; 361/679.46; 361/704; 361/709; 361/710; 361/715; 361/719; 165/80.3; 165/104.33; 165/185

(58) Field of Classification Search ....... 361/679.46–54, 361/690–697, 704–712, 717–728; 165/80.3, 165/104.33, 104.34, 121–126, 185; 257/706–727; 174/16.3, 252; 454/184; 439/73, 266, 330, 439/70, 71, 152, 154, 332, 487
See application file for complete search history.

(56) References Cited

U.S. PATENT DOCUMENTS

| 3,572,428 | A |   | 3/1971 | Monaco |   |
|---|---|---|---|---|---|
| 5,040,096 | A |   | 8/1991 | Churchill et al. |   |
| 5,161,087 | A |   | 11/1992 | Frankeny et al. |   |
| 5,218,854 | A | * | 6/1993 | Jarzebowicz et al. | 72/370.07 |
| 6,130,820 | A | * | 10/2000 | Konstad et al. | 361/695 |
| 6,297,961 | B1 |   | 10/2001 | Koizumi et al. |   |
| 6,319,756 | B2 |   | 11/2001 | Duesman et al. |   |
| 6,424,532 | B2 |   | 7/2002 | Kawamura |   |
| 6,449,161 | B2 |   | 9/2002 | Duesman et al. |   |
| 6,930,889 | B2 | * | 8/2005 | Harrison et al. | 361/774 |
| 7,023,701 | B2 | * | 4/2006 | Stocken et al. | 361/704 |
| 7,050,303 | B2 |   | 5/2006 | Park et al. |   |
| 7,079,396 | B2 |   | 7/2006 | Gates et al. |   |
| 7,106,595 | B2 | * | 9/2006 | Foster et al. | 361/721 |
| 7,187,552 | B1 | * | 3/2007 | Stewart et al. | 361/704 |
| 7,257,002 | B2 | * | 8/2007 | Nagahashi | 361/704 |
| 7,339,793 | B2 | * | 3/2008 | Foster et al. | 361/721 |
| 7,342,797 | B2 | * | 3/2008 | Kamath et al. | 361/721 |
| 7,372,702 | B2 |   | 5/2008 | Gauche et al. |   |
| 7,460,373 | B2 |   | 12/2008 | Nagahashi |   |
| 7,471,514 | B2 | * | 12/2008 | Chen | 361/695 |

(Continued)

FOREIGN PATENT DOCUMENTS

| KR | 2007000716 | A | * | 1/2007 |
| TW | 200937175 | A | * | 9/2009 |

*Primary Examiner* — Michail V Datskovskiy

(74) *Attorney, Agent, or Firm* — Cynthia G. Seal; Jeffrey L. Streets

(57) ABSTRACT

One embodiment of the present invention provides a computer memory system that includes at least one DIMM connector having a DIMM socket for releasably receiving a terminal edge of a DIMM. A metallic or otherwise highly heat-conductive base is secured to the DIMM connector. A pair of heat spreaders is secured to the base on opposing sides of the DIMM socket. Each heat spreader includes a DIMM-engagement portion spaced from the base. The heat spreaders are nondestructively moveable between an open position spaced apart for receiving the DIMM between the heat spreaders and a closed position for thermally engaging opposing faces of the DIMM. The heat spreaders provide a continuous thermally-conductive pathway between the DIMM-engagement portion and the base. Heatsink fins extend laterally from the base to provide cooling.

13 Claims, 3 Drawing Sheets

U.S. PATENT DOCUMENTS

| | | |
|---|---|---|
| 7,542,297 B2 | 6/2009 | Wehrly, Jr. et al. |
| 7,606,049 B2 | 10/2009 | Goodwin et al. |
| 7,612,446 B2 | 11/2009 | Dang et al. |
| 7,612,992 B2 | 11/2009 | Chen |
| 7,619,896 B2 | 11/2009 | Yamashita et al. |
| 7,626,823 B2 * | 12/2009 | Yang et al. ............... 361/719 |
| 7,969,736 B1 * | 6/2011 | Iyengar et al. ............ 361/699 |
| 2004/0250989 A1 * | 12/2004 | Im et al. .................. 165/80.1 |
| 2006/0221573 A1 | 10/2006 | Li |
| 2007/0121286 A1 * | 5/2007 | Foster et al. .............. 361/687 |

* cited by examiner ial energy. Therefore, the DIMM must be cooled in order to avoid thermal damage to the DIMM. Airflow in the form of forced convection along the face of the DIMMs, as conventionally supplied by fans or blowers, is most commonly used to cool the DIMMs.

MEMORY MODULE CONNECTOR HAVING MEMORY MODULE COOLING STRUCTURES

BACKGROUND

1. Field of the Invention

The present invention relates to computer memory systems, and more specifically relates to the cooling of memory modules in computer memory systems.

2. Background of the Related Art

In a computer system, software instructions to be executed by a processor (CPU) are loaded from nonvolatile memory and temporarily stored in volatile memory. Typically, volatile computer system memory is provided by one or more memory modules, such as dual in-line memory modules (DIMMs). A DIMM commonly includes a plurality of DRAM chips mounted on a thin printed circuit board. A DIMM generates heat as a byproduct of consuming electrical energy. Therefore, the DIMM must be cooled in order to avoid thermal damage to the DIMM. Airflow in the form of forced convection along the face of the DIMMs, as conventionally supplied by fans or blowers, is most commonly used to cool the DIMMs.

DIMMs are mounted to a motherboard at an angle, such as perpendicularly to the motherboard, often with several DIMMs spaced apart side-by-side and parallel one to the other. To increase the capacity of system memory, a greater number of DIMMs may be arranged at a closer spacing on the motherboard. Volume constrained systems, such as blade servers, may also require a closer spacing between DIMMs. However, increasing the number or power of DIMMs can lead to greater heat production, while the closer spacing between the DIMMs results in higher airflow impedance. Therefore, cooling systems must be designed to account for higher-power, higher-density memory systems.

As a result, individual DIMM manufacturers have developed their own cooling systems for use with their DIMM cards. These cooling systems may or may not be effective for cooling the DIMM, but their presence about the DIMM also affects the overall airflow through the computer system. Due the variety of available DIMMs and manufacturer-specific cooling solutions that may be installed in a computer system over time, the computer system designer is unable to take account for the resulting affects on system airflow.

BRIEF SUMMARY

One embodiment of the present invention provides a computer memory system. The computer memory system includes a DIMM connector having a DIMM socket for releasably receiving a terminal edge of a DIMM. A metallic base is secured to the DIMM connector and a plurality of heatsink fins are coupled to the base. A pair of heat spreaders is secured to the base on opposing sides of the DIMM socket. Each heat spreader includes a DIMM-engagement portion spaced from the base. The heat spreaders are nondestructively moveable between an open position spaced apart for receiving the DIMM between the heat spreaders and a closed position for thermally engaging opposing faces of the DIMM with the DIMM-engagement portions. The heat spreaders provide a continuous, thermally-conductive pathway between the DIMM-engagement portion and the base.

DETAILED DESCRIPTION

One embodiment of the present invention is a computer memory system having one or more DIMM connector that includes a cooling structure for cooling an inserted DIMM. The DIMM connector accommodates any of a variety of different DIMMS, such as DIMMs from different manufacturers having a standardized terminal edge for insertion in the DIMM connector(s). The cooling structure of each DIMM connector includes heat spreaders coupled along one edge to a metallic, heat conductive base on the DIMM connector. The heat spreaders are nondestructively movable from an open position to a closed position. In the open position, the DIMM may be received between the heat spreaders, for inserting the DIMM into the DIMM connector. In the closed position, the heat spreaders engage a large outer surface area of the DRAM modules (i.e. DRAM "chips") on the DIMM. The heat spreaders transfer heat from the DRAM chips to the heat conductive base, and to a first set of heatsink fins provided on the base. An optional second set of heatsink fins may also be provided directly on the heat spreaders opposite the heat spreader face contacting the DIMM. Airflow across the heatsink fins removes heat generated by the DIMM and reduces the operating temperature of the DIMM. An actuating mechanism may be provided for moving the heat spreaders between the open and closed positions, and a retainer may be provided for securing the heat spreaders in the closed position.

The DIMM connector accepts a wide variation of DIMMs as provided by different manufacturers and vendors, while providing constant, known airflow impedance. The known airflow impedance may be accounted for by selecting airflow parameters that provide sufficient cooling for the compatible DIMM that generates the most heat of any compatible DIMM. Fans or blowers may be controlled to enforce the airflow parameters. Thus, any DIMM inserted into the DIMM connector will be cooled sufficiently. Additionally, the socket design and cooling structure are preferably secured to the motherboard at the time of manufacture and are designed independent of which specific compatible DIMM is selected for the memory system, so as not to require a different connector and cooling structure design for each compatible DIMM.

Airflow between adjacent DIMM sockets may constitute upwards of 50% of the total airflow rate through a DIMM channel. In conventional memory systems, this airflow between adjacent DIMM sockets provides negligible cooling to the DIMMs. Desirably, the cooling solution provided by the disclosed embodiments utilizes previously under-utilized airflow between the DIMM sockets for cooling the DIMMs.

Figure 1:
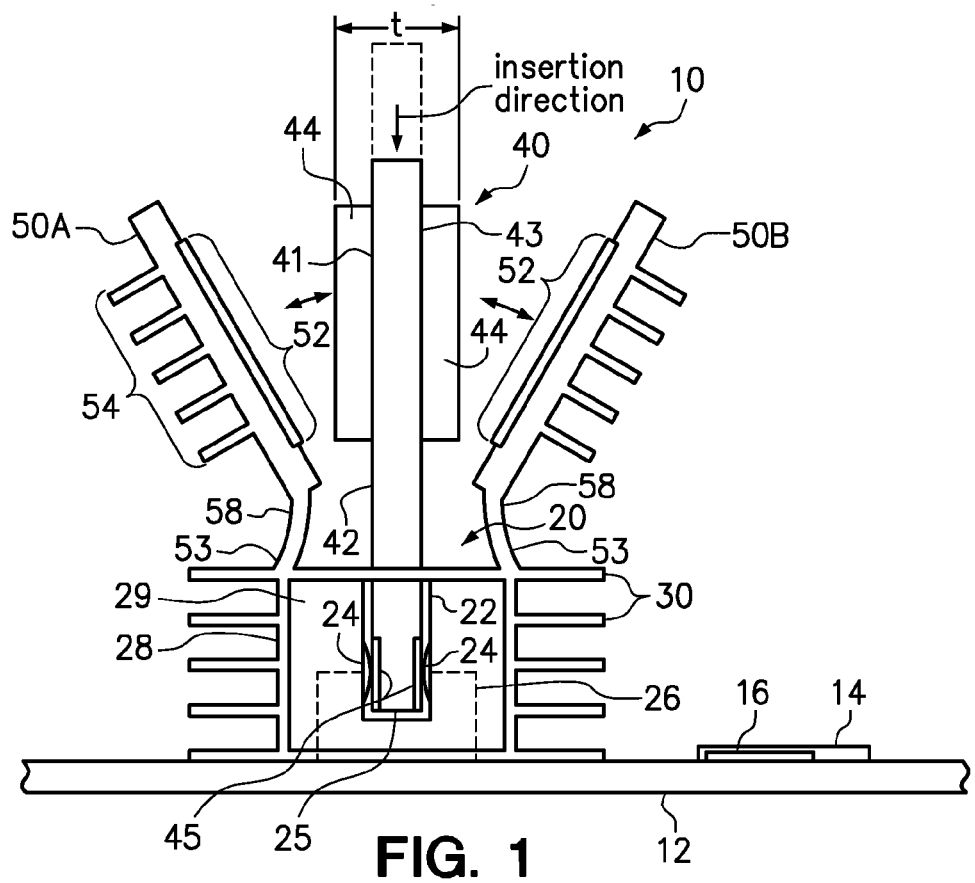
FIG. 1 is a schematic diagram of a computer memory system having a DIMM connector with heat spreaders in an open position.

FIG. 1 is a schematic diagram of a computer memory system 10 according to an embodiment of the invention. The computer memory system 10 includes a memory module connector 20 having a memory module socket 22 (hereinafter referred to as a DIMM socket) for releasably receiving a memory module 40 (hereinafter referred to as a DIMM) in an insertion direction. The memory module connector 20 is secured to a motherboard 12 and is in electronic communication with a central processing unit ("CPU") 14. The CPU 14 includes a memory controller 16 for reading and writing to the DIMM 40. The memory controller 16 in this embodiment is a circuit included on the CPU 14. However, the memory controller may alternatively be a chip or circuit mounted on the motherboard 12, separated from the CPU.

The DIMM 40 is a specific example of a memory module that includes a printed circuit board 42 having a plurality of DRAM chips 44. The DRAM chips 44 are mounted on opposing faces 41, 43 of the printed circuit board 42, and are in electronic communication with socket terminals 24 included on a terminal edge 25 of the printed circuit board 42. The socket terminals 24 are in electronic communication with the CPU 14, and more specifically with the memory controller 16 along electronic pathways 26 from the DIMM socket 22 to the motherboard 12, and along other electronic pathways provided on the motherboard 12 to the CPU 14. The electronic pathways on the motherboard 12 typically include signal traces that are generally understood in the art apart from the present invention. The socket terminals 24 are positioned on the printed circuit board 42, to electrically contact a corresponding plurality of DIMM terminals 45 on the inserted DIMM 40. Thus, inserting the DIMM 40 into the DIMM socket 22 places the DIMM 40 under the control of the memory controller 16. After the DIMM 40 has been inserted into the DIMM socket 22 as shown, the memory controller 16 may selectively read and write to the DRAM chips 44 on the inserted DIMM 40.

The DIMM connector 20 is compatible with a variety of different DIMMs provided by different manufacturers. Each manufacturer may provide DIMMs having unique design characteristics, such as the number, positioning, and/or spacing of DRAM chips 44. Different manufacturers may also provide DIMMs having different physical dimensions, such as the result of DRAM chips having a different thickness. Different DIMM manufacturers may further provide DIMMs having different memory capacities, which may relate to the different number and positioning of the DRAM chips 44 on a single DIMM 40. For example, a higher-capacity 8 GB DIMM may include a greater number of DRAM chips 44 at a closer spacing than a lower-capacity, 1 GB DIMM using similar DRAM chips. DRAM chips 44 in a higher-capacity DIMM may also include a stack of DRAM chips, such as two or three DRAM chips stacked, which affects the overall thickness t of the DIMM 40. However, each of the different DIMMs provided by different manufacturers may be compatible with the DIMM socket 20 by virtue of including a standard terminal edge 25 having DIMM terminals 24 at a prescribed positioning and spacing. Thus, the DIMM socket 20 may interchangeably receive any one of the different DIMMs provided by different manufacturers.

Figure 2:
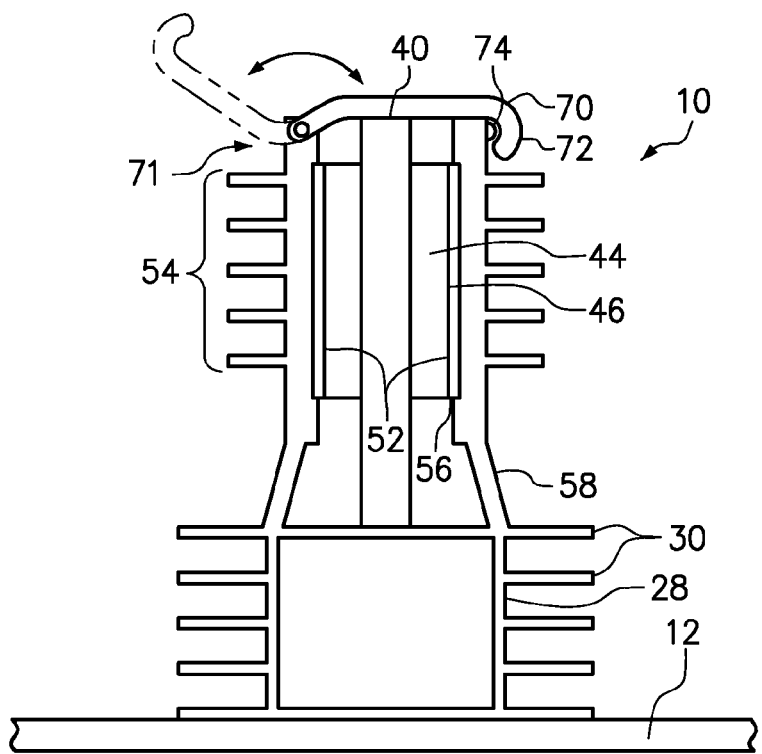
FIG. 2 is a schematic diagram of the computer memory system of FIG. 1 with the heat spreaders in a closed position.

The DIMM connector 20 includes an integrated cooling structure for cooling the DIMM 40. The cooling structure provides predictable airflow impedance that is independent of, or at least largely unaffected by, differences between the compatible DIMMs provided by different manufacturers and eliminates the need to use manufacturer-specific or DIMM-specific cooling structures. The cooling structure in this embodiment includes a thermally-conductive, optionally metallic base 28 secured to the DIMM connector 20. The metallic base 28 is secured to the DIMM connector 20. Interior surfaces of the metallic base 28 may closely contact exterior surfaces of the DIMM connector 20 on one or more sides, but primarily the long sides of connector. The cooling structure further includes a pair of heat-conductive, heat spreaders 50A, 50B. The heat spreaders 50A, 50B are secured at proximal ends 53 of the heat spreaders 50A, 50B to the base 28. Each heat spreader 50A, 50B includes a DIMM-engagement surface 52, wherein the DIMM-engagement surface 52 on the heat spreader 50A faces the DIMM-engagement surface 52 on the other heat spreader 50B. Each DIMM-engagement surface 52 is spaced along the heat spreader 50A, 50B from the base 28, at a distance that corresponds to a distance between the DRAM chips 40 and the base 28 when the DIMM 40 is fully installed to an operable position as shown. The heat spreaders are nondestructively movable between an open position, as shown in FIG. 1, and a closed position, as shown in FIG. 2. In the open position, the heat spreaders 50A, 50B are spaced apart for receiving the DIMM 40 there between. In the closed position of FIG. 2, the DIMM-engagement surfaces 52 of the heat spreaders 50A, 50B thermally engage the opposing faces 41, 43 of the DIMM 40, as further discussed below.

The heat spreaders 50A, 50B and the base 28 are each formed of thermally conductive materials. Suitable materials for the heat spreaders 50A, 50B and the base 28 may include selected metals, such as copper or aluminum. For the purpose of this disclosure, a material is considered thermally conductive if it has a thermal conductivity of at least about 100 W/m*K. By contrast, a material is considered a poor thermal conductor if it has a thermal conductivity of less than about 10 W/m*K. Materials having a thermal conductivity of greater than about 100 W/m*K and less than about 10 W/m*K may be deemed suitable or unsuitable as a thermal conductor depending on the specific application or embodiment, according to whether the materials provide sufficient cooling for a DIMM.

The cooling structure further includes a first set of heatsink fins 30 coupled to and extending outwardly from the base 28. The first set of heatsink fins 30 on the base 28 are vertically spaced with respect to the motherboard 12, and are oriented parallel to the motherboard 12. A second set of heatsink fins 54 are also optionally provided on an exterior surface of the heat spreaders 50A, 50B opposite the DIMM-engagement surfaces 52. The second set of heatsink fins 54 provides additional cooling capacity. Airflow through the memory system 10 may be provided by one or more fans. The direction of the airflow is parallel to the motherboard 12 (into the page). This orientation of the airflow directs the airflow between the first set of heatsink fins 30 on the metallic base 28 and the second set of heatsink fins 54 on the heat spreaders 50A, 50B.

In the embodiment of FIG. 1, the heat spreaders 50A, 50B include flexible, heat conductive attachment members 58 that attach the heat spreaders to the metallic base 28. The attachment members 58 are constructed of a flexible, heat conductive material. For example, the heat conductive portion 58 may comprise a flexible metal with a high thermal conductivity, such as steel, copper or a copper alloy, aluminum or an aluminum alloy, beryllium copper (BeCu), or other metal without limitation. The flexibility of the attachment members 58 allows the heat spreaders to be repeatedly moved back and forth between the open and closed positions, nondestructively, i.e., without severing the connection between the heat spreaders 50A, 50B and the base 28. The thermal conductivity of the attachment members 58 allows for efficient conduction of heat from the heat spreaders 50A, 50B to the base 28. The heat spreaders are optionally formed of the same flexible, heat conductive material used in the attachment members 58, to provide economical production of the heat spreaders 58, while providing sufficient heat conduction from the DIMM-engagement surfaces 52 to the base 28. The flexible, heat conductive members 58 may be relatively thin compared to the rest of the heat spreader to provide flexibility, while the DIMM-engagement surfaces 52 are relatively rigid to provide secure engagement between the heat spreaders 50A, 50B and the DRAM chips 44 in the closed position.

FIG. 2 is another schematic diagram of the computer memory system 10 with the heat spreaders 50A, 50B moved to the closed position. In the closed position, the DIMM-engagement surfaces 52 thermally engage the opposing faces 51, 53 of the printed circuit board 42, and more particularly engage flat outer surfaces 46 of the DRAM chips 44. In order to efficiently transfer heat from the DRAM chips 44 to the heat spreaders 50A, 50B, plenty of surface area contact should be provided between the DIMM-engagement surfaces 52 and the outer surfaces 46 of the DRAM chips 44. Maximizing this surface area of contact maximizes the heat transfer from DRAM chips 44 to the heat spreaders. The DIMM-engagement surface 52 should contact at least half (50%) of the combined surface area of the outwardly-facing outer surfaces 46 of the DRAM chips 44, and preferably contacts nearly 100% of the surface area of the outer surfaces 46 of the DRAM chips 44.

To maximize heat conduction between the outer surfaces 46 of the DRAM chips 44 and the DIMM-engagement surfaces 52 of the heat spreaders 50A, 50B, a thermal interface material (TIM) 56 is optionally applied to the DIMM-engagement surfaces 52 of the heat spreaders 50A, 50B. TIM may be alternatively referred to as a heat transfer compound or thermal paste. Commercially-available TIMs include silver-based compounds. The TIM 56 can reach into very small surface contours, cracks and other surface imperfections on both the DIMM-engagement surface 52 and the outer surfaces 46 of the DRAM chips 44 to ensure that heat is efficiently transferred from the DRAM chips 44 to the heat spreaders 50A, 50B.

The heat spreaders 50A, 50B may be retained in the closed position of FIG. 2 in a variety of different ways. For example the flexible, heat conductive attachment portions 58 of the heat spreaders 50A, 50B may bias the heat spreaders 50A, 50B to the closed position of FIG. 2 with sufficient force to reliably engage the DIMM engagement surfaces 52 with the DRAM chips 44. Additionally, or in the alternative, a retainer may be provided for retaining the heat spreaders 50A, 50B in the closed position. An example of a retainer is schematically shown in FIG. 2. The retainer in this embodiment comprises a latch 70 that is pivotably coupled to one of the heat spreaders 50A at a first end 71. The latch 70 is pivotable about the first end 71 to a latched position, wherein an opposing second end 72 engages a catch 74 on the second heat spreader 50B. The dimensions of the latch 70 are selected so that engaging the second end 72 of the latch 70 with the catch 74 urges the heat spreaders 50A, 50B into engagement with the DRAM chips 44 of the DIMM 40. The latch 70 is just one example of a retainer; one skilled in the art will appreciate that a variety of different latching mechanisms generally known in the art apart from the present invention may be adapted for use with the present invention to urge and retain the heat spreaders 50A, 50B in engagement with the DRAM chips 44 of the DIMM 40.

With the heat spreaders 50A, 50B in the closed position of FIG. 2, heat is transferred from the hot DRAM chips 44 to the heatsink fins 30 on the base 28 and to the optional heatsink fins 54 on the heat spreaders 50. Specifically, heat is transferred by heat conduction through the heat spreaders 50A, 50B to the optional second set of heatsink fins 54 on the heat spreaders 50A, 50B and to the heatsink fins 30 on the base 28. The airflow passing over the heatsink fins 30, 54 removes heat from the heatsink fins 30, 54 via forced convection. Thus, the DIMM 40 is continually cooled by the airflow passing over the heatsink fins 30, 54.

In the closed position of FIG. 2, the heatsink fins 30 on the base 28 and the heatsink fins 54 on the outer portions of the heat spreaders 50A, 50B are vertically spaced and horizontally extending parallel to the motherboard 12. Thus, airflow over the motherboard 12 easily flows between the heatsink fins 30, 54. The orientation of the heatsink fins 30, 54 parallel to the motherboard 12 minimizes the airflow impedance presented by the heatsink fins 30, 54. Heatsink fin parameters, such as a thickness of the individual heatsink fins 30, 54, and the quantity and spacing of the heatsink fins 30, 54, may be selected to provide predictable airflow impedance, along with a desired level of cooling to the inserted DIMM 40. These and other heatsink fin parameters may be selected, for example, to provide at least a minimum amount of cooling required by the compatible DIMM that generates the most heat, to ensure that any DIMM connected to the DIMM connector 20 will have at least the minimum required cooling for that DIMM. Then, known airflow impedance is provided by the computer memory system 10, regardless of which compatible DIMM is used with the DIMM connector 20. The known airflow impedance may then be compensated for by appropriate selection of airflow parameters, and one or more cooling fans or blowers may be controlled to enforce the airflow parameters selected for the computer memory system 10.

Figure 3:
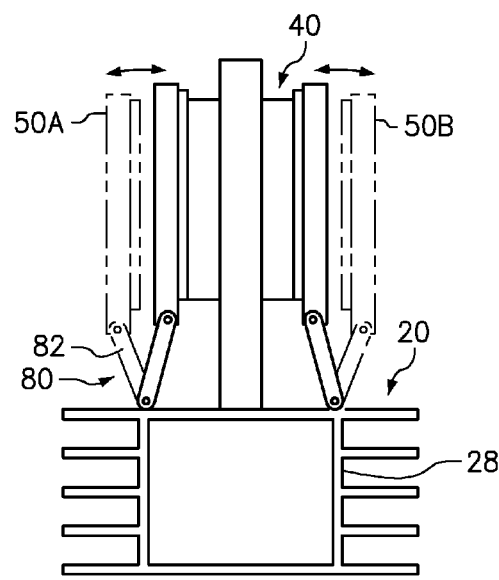
FIG. 3 is a schematic diagram of an alternative DIMM connector wherein the heat spreaders are coupled to the base using a hinged connection.

FIG. 3 is a schematic diagram of the DIMM connector 20 wherein the heat spreaders 50A, 50B are coupled to the base 28 using a hinged connector 80, in lieu of the flexible member 58 of FIG. 1. The optional heatsink fins 54 of FIGS. 1 and 2 are omitted in FIG. 3. The hinged connector 80 includes a pair of links 82 with each link 82 pivotally coupled at one end to the base 28 and pivotally coupled at an opposing end to the respective heat spreader 50. This hinged connection of the heat spreaders 50A, 50B to the base 28 allows the heat spreaders 50A, 50B to be horizontally translated while remaining in a vertical position substantially parallel to the DIMM 40. However, a hinged connection in another embodiment may provide as few as one pivot point between each heat spreader and the base. In FIG. 3, the open position of the heat spreaders 50A, 50B is indicated by a dashed line type, while the closed position of the heat spreaders 50A, 50B is indicated by a solid line type. This hinged connection of the heat spreaders 50A, 50B to the base 28 is another way to allow the heat spreaders 50A, 50B to be moved back and forth between the open position and the closed position nondestructively, i.e., so that moving the heat spreaders 50A, 50B between the open and closed positions does not sever the connection of the heat spreaders 50A, 50B to the base 28. A clip or latch (such as that shown in FIG. 2) may be provided for releasably retaining the heat spreaders 50A, 50B in the closed position. An actuating mechanism may be provided for moving the heat spreaders 50A, 50B between the open and closed positions. A suitable actuating mechanism may include a lever coupled to the links, a wedge type structure, or other actuating mechanisms known in the art.

Figure 4:
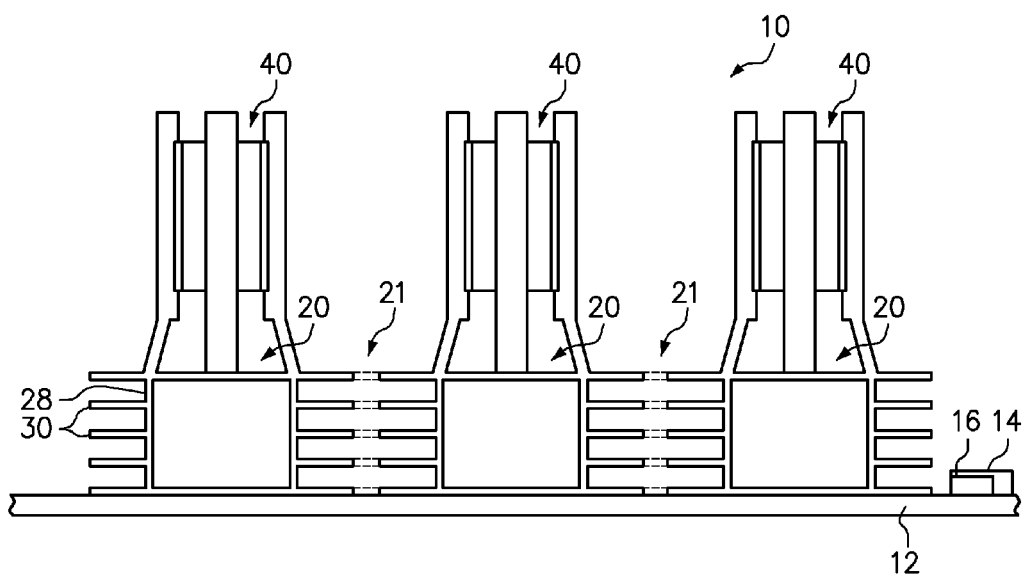
FIG. 4 is a schematic diagram of a computer memory system having a plurality of DIMM connectors spaced apart on the motherboard.

FIG. 4 is a schematic diagram of the computer memory system 10 having an arrangement of the least three of the DIMM connectors 20 spaced apart on the motherboard 12 and securing up to an equal number of inserted DIMMs 40. The optional heatsink fins 54 of FIGS. 1 and 2 are omitted. This diagram shows an example of spacing between multiple DIMM connectors 20. Here, the DIMM connector's 20 are arranged parallel to one another with the inserted DIMMS 40 correspondingly arranged parallel to one another above the connectors. The parallel arrangement of the DIMM connectors 20 and the DIMMs 40 allows airflow parallel to the motherboard 12 (into the page) to freely flow between the DIMMs 40 and DIMM connectors 20, and between the heatsink fins 30 coupled to the base 28 on each DIMM connector 20. Each of the DIMMs 40 is in communication with the memory controller 16 on the CPU 14, which is coupled to the motherboard 12.

A compact, efficient spacing between the DIMM connectors 20 may be selected, but with sufficient spacing to allow the heat spreaders 50A, 50B to be moved to the open position to receive the respective DIMMs 40. Here, the heatsink fins 30 on the base 28 of one connector 20 are aligned with, and extend toward, the heatsink fins 30 on the base 28 of an adjacent connector 20, but without the heatsink fins 30 on one connector 20 touching the heatsink fans 30 on the adjacent connector 20. However, in another embodiment, continuous heatsink fins may extend (as generally indicated at 21 in dashed lines) from the base 28 of one connector 20 to the base 28 of an adjacent connector 20, thereby providing more surface area for cooling and a pathway for DIMM to DIMM transfer or spreading of heat.

Figure 5:
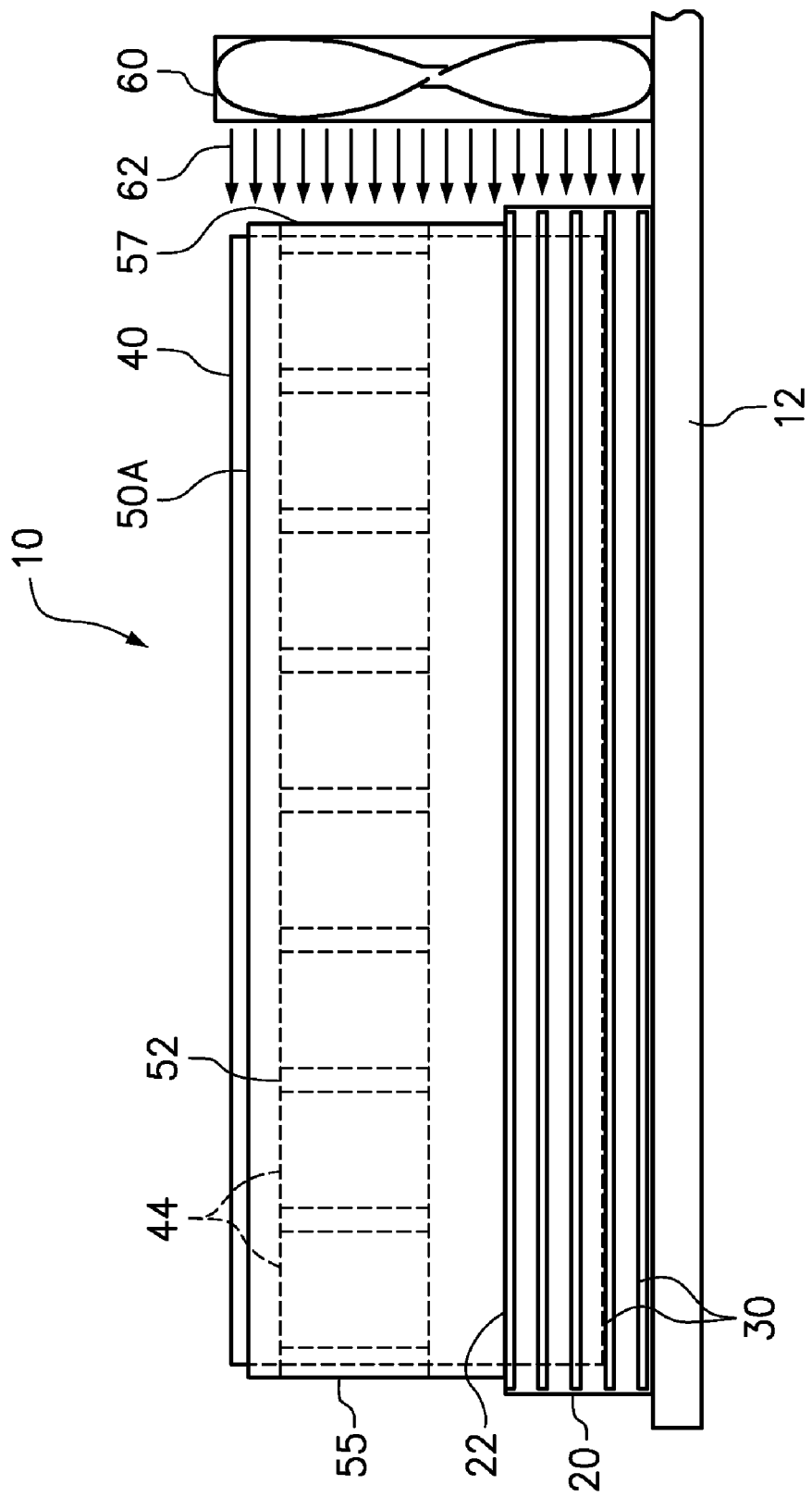
FIG. 5 is a side elevation view of the memory system of FIG. 1, omitting the optional second set of heatsink fins.

FIG. 5 is a side elevation view of the memory system 10 of FIG. 1, omitting the optional second set of heatsink fins 54. The DIMM 40 in this example has eight DRAM chips 44. The first set of heatsink fins 30 is parallel to the motherboard 12. One of the heat spreaders 50A is visible, while the other heat spreader 50B (see FIG. 1) is hidden from view on the opposite side of the DIMM 40. The DIMM-engagement surface 52 is a continuous surface from near one vertical edge 55 of the heat spreader 50A to the opposite vertical edge 57 of the heat spreader 50A. The heat spreader 50A extends nearly the full height of the DIMM 44, from the top 22 of the base 28 to above the DRAM chips 44. A fan 60 is mounted perpendicularly to the motherboard 12, directing airflow 62 in a direction generally parallel to the motherboard 12 and between the heatsink fins 30. The general alignment of the airflow 62 with the heatsink fins 30 minimizes the airflow impedance presented by the heatsink fins 30. The fan 60 also extends nearly the full height of the DIMM 40, so that the airflow 62 is provided between multiple DIMMs 40. Thus, the airflow 62 also passes between the optional second set of cooling fins 54 (see FIG. 1) which may be mounted above the first set of cooling fins 30. Additional DIMMs and DIMM connectors not shown in FIG. 5 may be provided on the motherboard 12.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus for cooling a memory module, comprising:
a memory module connector having a socket for releasably receiving a terminal edge of a memory module;
a metallic base secured to the memory module connector;
a plurality of heatsink fins coupled to the base;
a pair of heat spreaders secured to the base on opposing sides of the memory module socket, each heat spreader including a memory module-engagement portion, spaced from the base, the heat spreaders nondestructively moveable between an open position spaced apart for receiving the memory module between the heat spreaders and a closed position for thermally engaging opposing faces of the memory module with the memory module-engagement portions, the heat spreaders providing a continuous thermally-conductive pathway between the memory module-engagement portion and the base; and
a latch for releasably retaining the heat spreaders in the closed position.

2. The apparatus of claim 1, further comprising:
a plurality of heatsink fins coupled to the heat spreaders adjacent to the memory module-engagement portion.

3. The apparatus of claim 1, wherein the memory module-engagement portion of the heat spread arms comprise a flat surface that engages at least half of the surface area of a flat outer surface of DRAM chips on the memory module in the closed position.

4. The apparatus of claim 1, further comprising:
a hinge coupling the heat spreaders to the base, the heat spreaders pivotable about the hinge between the open and closed positions.

5. The apparatus of claim 1, wherein the heat spreaders comprise a flexible, heat-conductive portion securing the heat spreaders to the base, wherein the flexible, heat-conductive portion is repeatedly flexible to allow movement of the heat spreaders between the open and closed positions.

6. An apparatus for cooling a memory module, comprising:
a plurality of memory module connectors spaced-apart on a motherboard, each memory module connector having a socket for releasably receiving a terminal edge of a respective memory module;
a metallic base secured to each memory module connector;
a set of heatsink fins coupled to each base and extending laterally away the base; and
a pair of heat spreaders secured to opposing sides of each socket, each heat spreader in a pair including a memory module-engagement portion, spaced from the base, the heat spreaders nondestructively moveable between an open position spaced apart for receiving the respective memory module between the heat spreaders and a closed position for thermally engaging opposing faces of the respective memory module with the memory module-engagement portions, the heat spreaders providing a continuous thermally-conductive pathway between the memory module-engagement portion and the base; and
a latch for releasably retaining the heat spreaders in the closed position.

7. The apparatus of claim 6, further comprising:

a plurality of heatsink fins coupled to the heat spreaders adjacent to the memory module-engagement portion.

8. The apparatus of claim 6, wherein the memory module-engagement portion of the heat spread arms comprise a flat surface that engages at least half of the surface area of a flat outer surface of DRAM chips on the memory module in the closed position.

9. The apparatus of claim 6, further comprising:

a hinge coupling the heat spreaders to the base, the heat spreaders pivotable about the hinge between the open and closed positions.

10. The apparatus of claim 6, wherein the heat spreaders comprise a flexible, heat-conductive portion securing the heat spreaders to the base, wherein the flexible, heat-conductive portion is repeatedly flexible to allow movement of the heat spreaders between the open and closed positions.

11. The apparatus of claim 6, wherein the plurality of memory module connectors includes a first and second memory module connectors, and wherein the set of heatsink fins coupled to the base of the first memory module connector are thermally engaged with the set of heatsink fins coupled to the base of the second memory module connector.

12. An apparatus for cooling a memory module, comprising:

a memory module connector having a socket for releasably receiving a terminal edge of a memory module;

a metallic base secured to the memory module connector;

a plurality of heatsink fins coupled to the base;

a pair of heat spreaders secured to the base on opposing sides of the memory module socket, each heat spreader including a memory module-engagement portion, spaced from the base, the heat spreaders nondestructively moveable between an open position spaced apart for receiving the memory module between the heat spreaders and a closed position for thermally engaging opposing faces of the memory module with the memory module-engagement portions, the heat spreaders providing a continuous thermally-conductive pathway between the memory module-engagement portion and the base; and a hinged connection coupling the pair of heat spreaders to the base, the hinged connection comprising a pair of links, each link pivotably coupled at one end to the base and pivotably coupled at an opposing end to a respective one of the heat spreaders.

13. The apparatus of claim 12, wherein the hinged connection allows the heat spreaders to be horizontally translated while remaining in a vertical position substantially parallel to the memory module.

* * * * *